US 11,978,629 B2

United States Patent
Nam et al.

(10) Patent No.: US 11,978,629 B2
(45) Date of Patent: May 7, 2024

(54) METHOD FOR MANUFACTURING ALUMINUM NITRIDE-BASED TRANSISTOR

(71) Applicant: KOREA POLYTECHNIC UNIVERSITY INDUSTRY ACADEMIC COOPERATION FOUNDATION, Siheung-si (KR)

(72) Inventors: Ok Hyun Nam, Seoul (KR); Ui Ho Choi, Siheung-si (KR)

(73) Assignee: KOREA POLYTECHNIC UNIVERSITY INDUSTRY ACADEMIC COOPERATION FOUNDATION, Siheung-si (KR)

(*) Notice: Subject to any disclaimer, the term of this patent is extended or adjusted under 35 U.S.C. 154(b) by 408 days.

(21) Appl. No.: 17/297,659

(22) PCT Filed: Nov. 27, 2019

(86) PCT No.: PCT/KR2019/016510
§ 371 (c)(1),
(2) Date: May 27, 2021

(87) PCT Pub. No.: WO2020/111789
PCT Pub. Date: Jun. 4, 2020

(65) Prior Publication Data
US 2022/0051888 A1    Feb. 17, 2022

(30) Foreign Application Priority Data

Nov. 30, 2018  (KR) .................. 10-2018-0152578
May 28, 2019   (KR) .................. 10-2019-0062672

(51) Int. Cl.
*H01L 21/02*    (2006.01)
*H01L 29/20*    (2006.01)
(Continued)

(52) U.S. Cl.
CPC .... *H01L 21/0254* (2013.01); *H01L 21/02271* (2013.01); *H01L 21/02458* (2013.01);
(Continued)

(58) Field of Classification Search
CPC ........... H01L 21/0254; H01L 21/02271; H01L 21/02458; H01L 29/2003; H01L 29/66462;
(Continued)

(56) References Cited

U.S. PATENT DOCUMENTS

2003/0102482 A1  6/2003  Saxler
2014/0367743 A1* 12/2014  Inoue .................. H01L 29/7783
                                                         257/194

FOREIGN PATENT DOCUMENTS

JP    2009158804    7/2009
JP    2014003056    1/2014
(Continued)

OTHER PUBLICATIONS

Li, Chuanhao, et al. "Improvement of breakdown and current collapse characteristics of Gan HEMT with a polarization-graded Algan Buffer." Semiconductor Science and Technology, vol. 30, No. 3, 2015, p. 035007, https://doi.org/10.1088/0268-1242/30/3/035007. (Year: 2015).*
(Continued)

*Primary Examiner* — J. E. Schoenholtz
(74) *Attorney, Agent, or Firm* — LEX IP MEISTER, PLLC (57) ABSTRACT

The present invention relates to a method of manufacturing an AlN-based transistor. An AlN-based high electron mobility transistor (HEMT) element according to the present invention may use an AlN buffer layer, and include an AlGaN composition change layer inserted into a GaN/AlN interface to remove or suppress a degree of generation of a
(Continued)

two-dimensional hole gas (2DHG), thereby decreasing an influence of a coulomb drag on a two-dimensional electron gas (2DEG) layer and improving mobility of a two-dimensional electron gas (2DEG).

11 Claims, 6 Drawing Sheets

(51) Int. Cl.
  *H01L 29/66* (2006.01)
  *H01L 29/778* (2006.01)

(52) U.S. Cl.
  CPC .... *H01L 29/2003* (2013.01); *H01L 29/66462* (2013.01); *H01L 29/778* (2013.01)

(58) Field of Classification Search
  CPC ............. H01L 29/778; H01L 21/02502; H01L 29/201; H01L 29/7786; H01L 21/0251; H01L 29/7783; H01L 29/7788; H01L 2924/10323; H01L 2924/1033; H01L 2924/10344
  See application file for complete search history.

(56) References Cited

FOREIGN PATENT DOCUMENTS

| JP | 2015026770 | 2/2015 |
| JP | 2018067712 | 4/2018 |

OTHER PUBLICATIONS

Liang, Li, et al. "MOCVD growth and characterization of epitaxial AlxGa1-xN Films." Chinese Physics Letters, vol. 24, No. 5, 2007, pp. 1393-1396, https://doi.org/10.1088/0256-307x/24/5/074. (Year: 2007).*
KIPO, Notice of Allowance of KR 10-2019-0062672 dated Jan. 22, 2021.
KIPO, PCT Search Report of PCT/KR2019/016510 dated Jun. 2, 2020.

* cited by examiner

HALL EFFECT MEASUREMENT RESULT OF GENERAL AIN-BASED HEMT

| Resistivity | | Hall | | Concentration | |
|---|---|---|---|---|---|
| Sheet | 471.8 ohm/sq | Coef. | -74.1 m²/C | Sheet | -8.419e+12 /cm² |
| Bulk | ohm-cm | Mobility | 1.57e+03 cm²/V·s | Bulk | /cm³ |

HALL EFFECT MEASUREMENT RESULT OF AIN-BASED HEMT INTO WHICH AlGaN COMPOSITION CHANGE LAYER IS INSERTED

| Resistivity | | Hall | | Concentration | |
|---|---|---|---|---|---|
| Sheet | 377.6 ohm/sq | Coef. | -68.3 m²/C | Sheet | -9.134e+12 /cm² |
| Bulk | ohm-cm | Mobility | 1.81e+03 cm²/V·s | Bulk | /cm³ | ns
METHOD FOR MANUFACTURING ALUMINUM NITRIDE-BASED TRANSISTOR

TECHNICAL FIELD

The present invention relates to an ALUMINUM NITRIDE(AlN)-based transistor, and in particular, to an AlN buffer layer-based high electron mobility transistor (HEMT) capable of improving mobility characteristics.

BACKGROUND ART

In general, a nitride-based high electron mobility transistor (HEMT) is implemented in an $Al_xIn_yGa_{1-x-y}N/GaN$ or $Al_xIn_yGa_{1-x-y}N/AlN/GaN$ structure on a silicon (Si) substrate or the like using the silicon substrate, and is being utilized for high-power and high-frequency electronic elements using high electron concentration characteristics of high mobility of a two-dimensional electron gas (2DEG) generated on an $Al_xIn_yGa_{1-x-y}N/GaN$ or AlN/GaN interface.

Figure 1:
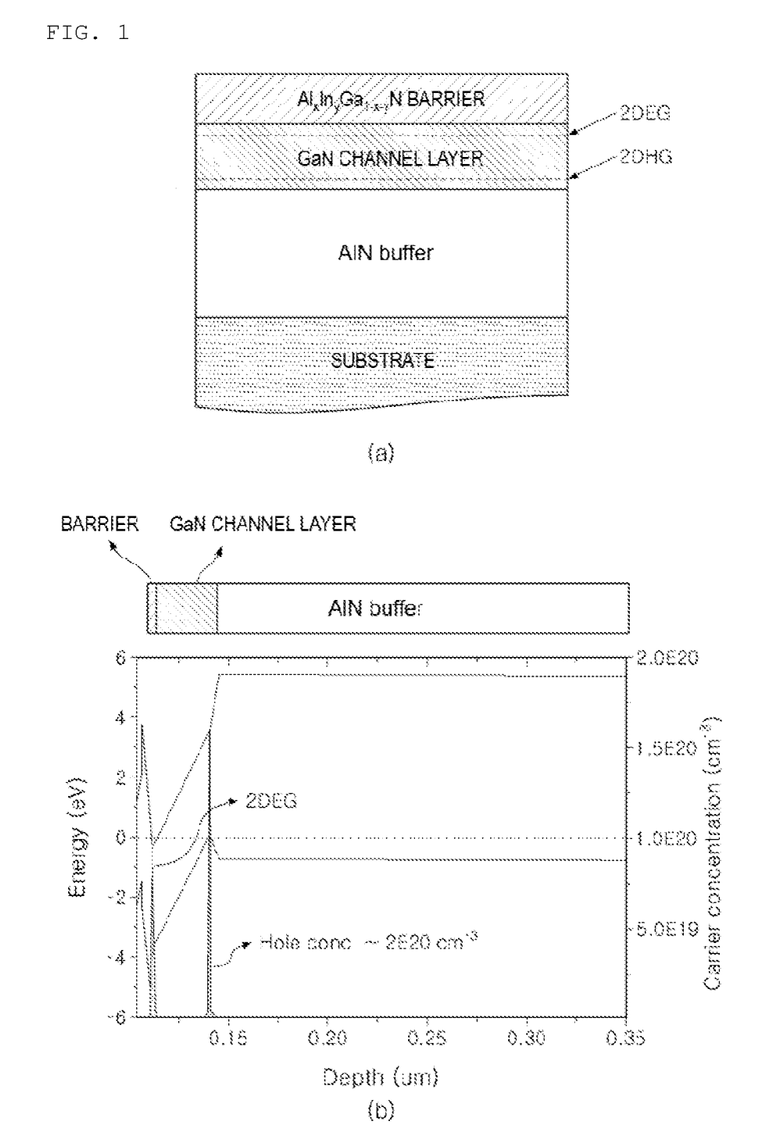
FIG. 1 is a view illustrating a structure of a high electron mobility transistor (HEMT) according to the related art.

Meanwhile, in order to implement a next-generation high-performance nitride-based HEMT, an HEMT having an $Al_{1-x-y}Ga_xIn_yN/GaN/AlN$ structure in which AlN having a high band gap, thermal conductivity, and excellent physical properties is used as a material of a buffer layer as illustrated in FIG. 1 has been proposed, but there is a problem that a high-density two-dimensional hole gas (2DHG) is generated due to a large negative polarization charge on an GaN/AlN interface, which has an influence of a coulomb drag on a 2DEG layer to lower mobility of the 2DEG layer.

DISCLOSURE

Technical Problem

Therefore, the present invention has been made in an effort to solve the problem described above, and an object of the present invention is to provide an AlN-based high electron mobility transistor (HEMT) element capable of decreasing an influence of a coulomb drag on a two-dimensional electron gas (2DEG) layer and improving mobility of a 2DEG by using an AlN buffer layer and inserting an AlGaN composition change layer into a GaN/AlN interface to remove or suppress a degree of generation of a two-dimensional hole gas (2DHG).

Technical Solution

According to an aspect of the present disclosure, a method of manufacturing a high electron mobility transistor (HEMT) includes: forming a sequentially stacked structure in which an AlN buffer layer, a composition change layer, a GaN channel layer, and an $Al_xIn_yGa_{1-x-y}N$ barrier layer (here, x and y are real numbers between 0 and 1) are sequentially stacked on a semiconductor substrate, wherein the composition change layer is an $Al_mGa_{1-m}N$ layer whose Al composition is changed from the AlN buffer layer to a position of the GaN channel layer, and is a layer formed so that m is a real value decreasing from an edge of the AlN buffer layer to an edge of the GaN channel layer.

m may be 0.8 to 1.0 at the edge of the AlN buffer layer, and may be 0.0 to 0.2 at the edge of the GaN channel layer.

The semiconductor substrate may include a single crystal substrate formed of SiC, sapphire, Si, GaN, or AlN.

The sequentially stacked structure may be obtained by performing an in-situ process in a metal-organic chemical vapor deposition (MOCVD) or molecular beam epitaxy (MBE) equipment.

In formation of the composition change layer, a change in an Al composition between the edge of the AlN buffer layer and the edge of the GaN channel layer may be obtained by changing reactor conditions including a temperature, a pressure, a flow rate of an atmospheric gas, or a ratio between Al, Ga, and N sources of a reactor.

m may be changed as a value that is linearly decreased from the edge of the AlN buffer layer to the edge of the GaN channel layer, is non-linearly decreased so that a rate of change is larger at the edge of the AlN buffer layer, or is non-linearly decreased so that a rate of change is larger at the edge of the GaN channel layer.

The composition change layer may be formed by changing reactor conditions continuously or discontinuously in time so that the change in the Al composition from the edge of the AlN buffer layer to the edge of the GaN channel layer is in a continuous form, a discontinuous form, or a combination thereof, in the linear decrease or the non-linear decrease.

The method of manufacturing a high electron mobility transistor (HEMT) may further include stacking an AlN insertion layer between the GaN channel layer and the $Al_xIn_yGa_{1-x-y}N$ barrier layer in a case where the $Al_xIn_yGa_{1-x-y}N$ barrier layer is not formed of AlN. The AlN insertion layer may have a thickness of 5 to 20 Å.

The method of manufacturing a high electron mobility transistor (HEMT) may be to be applied to operate a transistor by using a two-dimensional electron gas (2DEG) formed between the GaN channel layer and the $Al_xIn_yGa_{1-x-y}N$ barrier layer due to spontaneous and piezoelectric polarization for electron flow between a source terminal and a drain terminal.

Due to formation of the composition change layer, a degree of generation of a two-dimensional hole gas (2DHG) between the AlN buffer layer and the GaN channel layer may be removed or suppressed to decrease an influence of a coulomb drag on a two-dimensional electron gas (2DEG) layer between the GaN channel layer and the $Al_xIn_yGa_{1-x-y}N$ barrier layer, thereby improving mobility of a two-dimensional electron gas (2DEG), and the composition change layer may prevent quality deterioration of the GaN channel layer due to compressive stress generated between the AlN buffer layer and the GaN channel layer to allow the GaN channel layer having a high quality to be formed.

According to another aspect of the present invention, a high electron mobility transistor (HEMT) element having the sequentially stacked structure is manufactured by the method of manufacturing a high electron mobility transistor (HEMT) as described above, and such an HEMT element may be utilized for a high-power high-frequency electronic element, an electronic element for optical detection, or the like, using high electron concentration characteristics of high mobility.

Advantageous Effects

An AlN-based HEMT element according to the present invention may use an AlN buffer layer, have a structure in which an AlGaN composition change layer is inserted into a GaN/AlN interface, remove or suppress a degree of generation of a two-dimensional hole gas (2DHG) to decrease an influence of a coulomb drag on a two-dimensional electron gas (2DEG) layer, and improve mobility of a two-dimensional electron gas (2DEG).

In addition, the AlN-based HEMT element according to the present invention prevents quality deterioration of GaN due to compressive stress generated in a GaN/AlN structure and allows a GaN thin film having a high quality to be formed, by the inserted AlGaN composition change layer.

DESCRIPTION OF DRAWINGS

The accompanying drawings included as a part of a detailed description in order to assist in understanding of the present invention provide exemplary embodiments of the present invention and describe the technical spirit of the present invention together with the detailed description.

BEST MODE

Hereinafter, the present invention will be described in detail with reference to the accompanying drawings. Here, in the respective drawings, the same components will be denoted by the same reference numerals. In addition, a detailed description for functions and/or configurations that have been well-known will be omitted. In the following specification, portions required for understanding operations according to various exemplary embodiments will be mainly described, and a description for components that may obscure the gist of the present invention will be omitted. In addition, some components in the drawings may be exaggerated, omitted, or schematically illustrated. Sizes of the respective components do not reflect actual sizes of the respective components. Therefore, contents mentioned herein are not limited by relative sizes of or intervals between components illustrated in the accompanying drawings.

In describing exemplary embodiments of the present invention, when it is decided that a detailed description of a well-known technology related to the present invention may unnecessarily obscure the gist of the present invention, the detailed description will be omitted. In addition, the following terms are terms defined in consideration of the functions in the present invention, and may be construed in different ways by the intention of users and operators, customs, or the like. Therefore, these terms should be defined on the basis of contents throughout the present specification. The terms used in a detailed description are only for describing exemplary embodiments of the present invention, and should not be restrictive by any means. Unless explicitly used otherwise, expressions in a singular form include the meaning in a plural form. In the present description, expressions such as "include" or "comprise" are used to refer to certain features, numbers, steps, operations, components, or some or a combination thereof, and should not be construed to preclude the presence or addition of one or more other features, numerals, steps, operations, components other than those described, or some or a combination thereof.

In addition, terms such as "first" and "second" may be used to describe various components, but these components are not limited by these terms, and these terms are used only to distinguish one component from another component.

Figure 2:
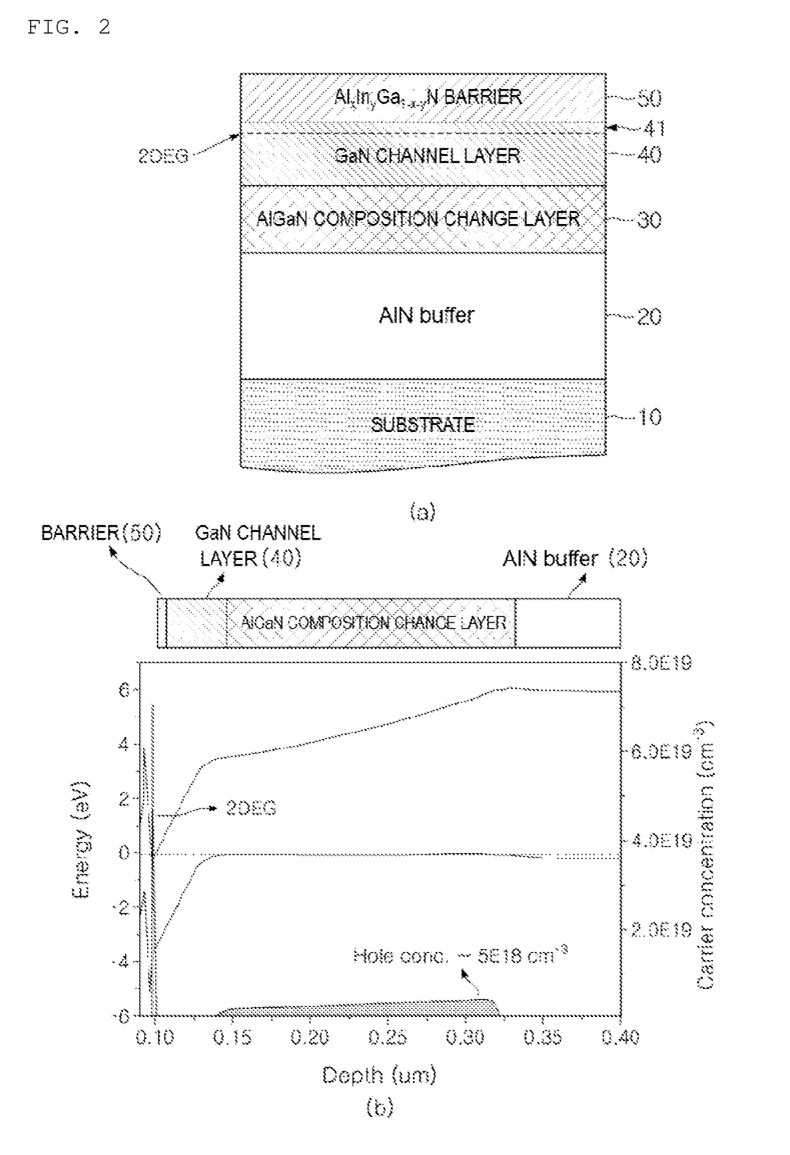
FIG. 2A is a view for describing a method of manufacturing a high electron mobility transistor (HEMT) according to an exemplary embodiment of the present invention.
FIG. 2B is a view illustrating a band gap and a carrier concentration according to a depth for describing characteristics of an AlGaN composition change layer according to the present invention.

FIG. 2A is a view for describing a method of manufacturing a high electron mobility transistor (HEMT) according to an exemplary embodiment of the present invention.

Referring to FIG. 2A, the high electron mobility transistor (HEMT) according to an exemplary embodiment of the present invention may be obtained by sequentially stacking an AlN buffer layer 20, an AlGaN composition change layer 30, a GaN channel layer 40, and an $Al_xIn_yGa_{1-x-y}N$ barrier layer 50 (here, x and y are real numbers between 0 and 1) on a semiconductor substrate 10 such as a single crystal substrate formed of SiC, sapphire, Si, GaN, or AlN by an in-situ process in a reactor of a metal-organic chemical vapor deposition (MOCVD) or molecular beam epitaxy (MBE) equipment, or the like.

In such a sequential stacking process, each process may be performed in a state of appropriately matching a temperature, a pressure, a flow rate of an atmospheric gas, or a ratio between sources to the reactor [u1]. The AlN buffer layer 20 may be formed to have a thickness of 0.5 μm or more, and may be formed to have, for example, about 0.5 to 5.0 μm. The composition change layer 30 may be formed to have a thickness of 0.005 μm or more, and may be formed to have, for example, about 0.005 to 1.0 μm. The GaN channel layer 40 may be formed to have a thickness of 0.01 μm or more, and may be formed to have, for example, about 0.01 to 1.0 μm. The $Al_xIn_yGa_{1-x-y}N$ barrier layer 50 may be formed to have a thickness of 0.01 μm or more, and may be formed to have, for example, about 0.01 to 1.0 μm.

In such an HEMT structure, a two-dimensional electron gas (2DEG) formed between the GaN channel layer 40 and the $Al_xIn_yGa_{1-x-y}N$ barrier layer 50 due to spontaneous and piezoelectric polarization may be used for electron flow between a source terminal and a drain terminal to be applied to operate a transistor.

Although not illustrated in the drawing, such an HEMT structure may be manufactured in a metal oxide semiconductor field effect transistor (MOSFET) structure by appropriately forming a gate terminal, the source terminal, and the drain terminal on the $Al_xIn_yGa_{1-x-y}N$ barrier layer 50, and may be manufactured in an element form so that a transistor operation is performed. For example, such an HEMT structure may be utilized for a high-frequency electronic element having a high output, an electronic element for optical detection, or the like, using high electron concentration characteristic of high mobility.

In addition, in order to improve high electron mobility characteristics of the two-dimensional electron gas (2DEG), in some cases, when the $Al_xIn_yGa_{1-x-y}N$ barrier layer 50 is not formed of AlN (for example, when x is not 1 and y is not 0), a binary AlN insertion layer 41, that is, AlN, may be further stacked at a thickness of 5 to 20 Å between the GaN channel layer 40 and the $Al_xIn_yGa_{1-x-y}N$ barrier layer 50.

In particular, in the present invention, the composition change layer 30 is an $Al_mGa_{1-m}N$ layer whose Al composition is changed from the AlN buffer layer 20 to a position of the GaN channel layer 40, and is a layer formed so that m is a real value decreasing from an edge of the AlN buffer layer 20 to an edge of the GaN channel layer 40. For example, m may be 0.8 to 1.0 (for example, 1.0) at the edge of the AlN buffer layer 20, and may be 0.0 to 0.2 (for example, 0.0) at the edge of the GaN channel layer 40.

Figure 6:
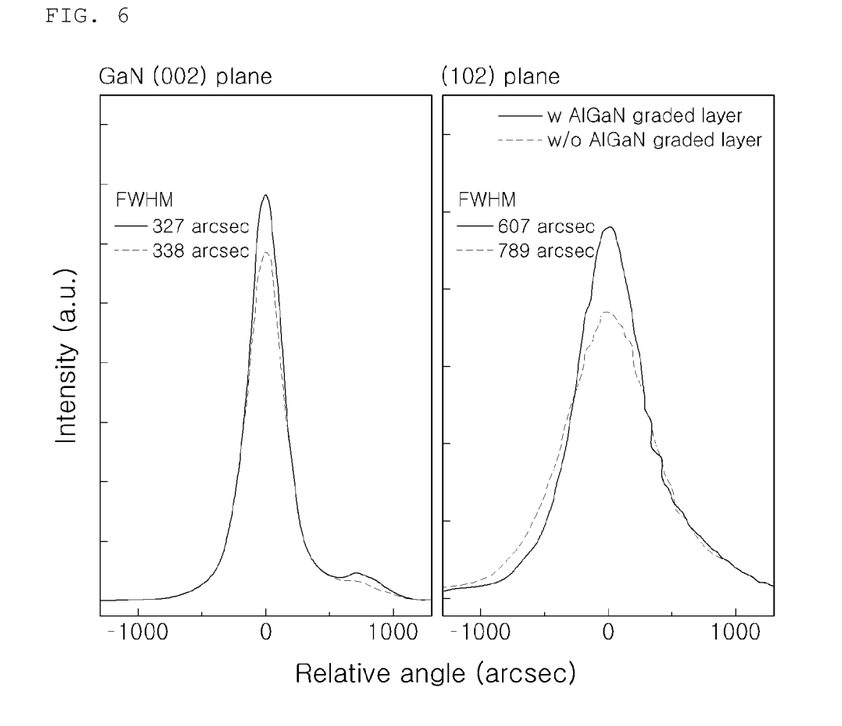
FIG. 6 is a view for describing a crystallinity quality of a GaN channel layer according to the presence or absence of the AlGaN composition change layer according to the present invention.

Due to the formation of such a composition change layer 30, as illustrated in FIG. 2B, a degree of generation of a two-dimensional hole gas (2DHG) between the AlN buffer layer 20 and the GaN channel layer 40 is removed or suppressed (a 2DHG concentration becomes very low as compared with FIG. 1B) to decrease an influence of a coulomb drag on a two-dimensional electron gas (2DEG) layer between the GaN channel layer 40 and the $Al_xIn_yGa_{1-x-y}N$ barrier layer 50 (decrease a drag of electrons), thereby improving mobility of a two-dimensional electron gas (2DEG), and the composition change layer 30 may prevent quality deterioration of the GaN channel layer 40 due to compressive stress generated between the AlN buffer layer 20 and the GaN channel layer 40 to allow the GaN channel layer 40 having a high quality to be formed. That is, deterioration of crystallinity or a defect or the like may occur due to compressive stress caused by a difference (see FIG. 7) in lattice constant between the AlN buffer layer 20 and the GaN channel layer 40 to deteriorate a quality of the GaN channel layer 40, but the composition change layer 30 may smoothly change the difference in lattice constant to allow the GaN channel layer 40 having a high quality to be formed as illustrated in FIG. 6.

In the formation of the composition change layer 30, a change in an Al composition between the edge of the AlN buffer layer 20 and the edge of the GaN channel layer 40 may be generated by changing reactor conditions including a temperature, a pressure, a flow rate of an atmospheric gas, or a ratio between Al, Ga, and N sources of the reactor.

Figure 3:
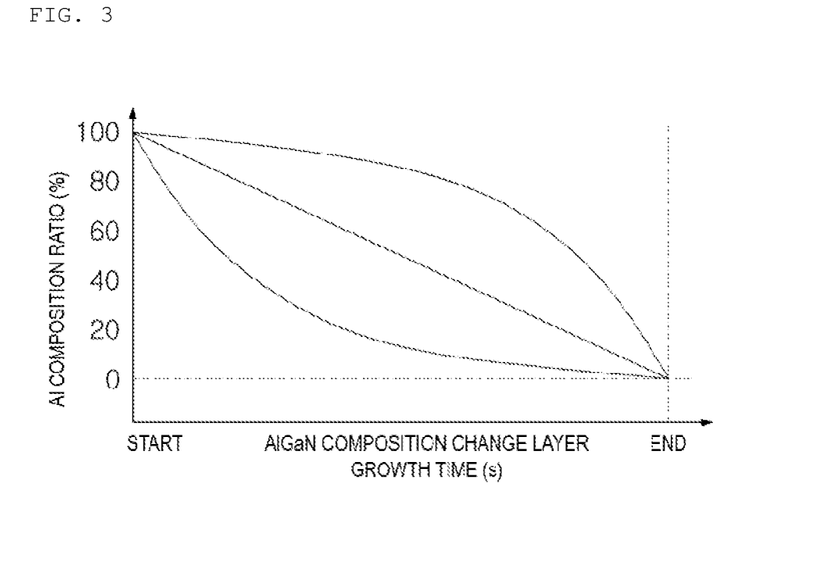
FIG. 3 illustrates an example of an Al composition profile over time that forms the AlGaN composition change layer according to the present invention with a continuous Al composition.

FIG. 3 illustrates an example of an Al composition profile over time that forms the AlGaN composition change layer 30 according to the present invention with a continuous Al composition.

As illustrated in FIG. 3, a change in a value of m (change in an Al composition) from the edge of the AlN buffer layer 20 to the edge of the GaN channel layer 40 for the $Al_mGa_{1-m}N$ composition change layer 30 may be configured to be linearly decreased, may be configured to be non-linearly decreased so that a rate of change is larger at the edge (left side of a graph) of the AlN buffer layer 20, or may be configured to be non-linearly decreased so that a rate of change is larger at the edge (right side of a graph) of the GaN channel layer 40. The change in the value of m may be maintained in any one form of such a linear decrease and non-linear decrease over time or may be configured in a combination form of such a linear decrease and non-linear decrease [u2].

Figure 4:
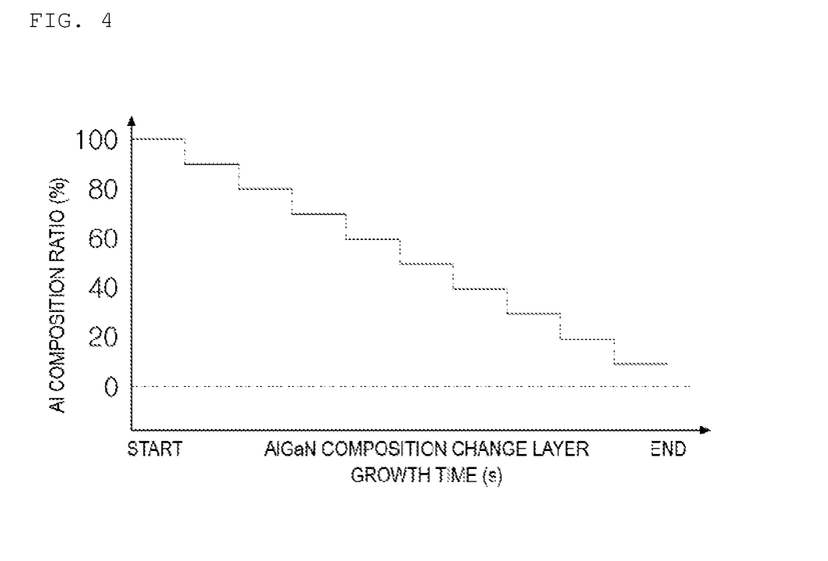
FIG. 4 illustrates an example of an Al composition profile over time that forms the AlGaN composition change layer according to the present invention with a discontinuous Al composition.

FIG. 4 illustrates an example of an Al composition profile over time that forms the AlGaN composition change layer 30 according to the present invention with a discontinuous Al composition. FIG. 4 illustrates a discontinuous change in an Al composition in a case where the change in the value of m (Al composition change) in FIG. 3 is the linear decrease, but a discontinuous change in an Al composition may be similarly made for two examples of the non-linear decrease of FIG. 3, and such a linear decrease and non-linear decrease may be combined with each other. In addition, the AlGaN composition change layer 30 may also be formed by combining the continuous change in the Al composition of FIG. 3 and the discontinuous change in the Al composition of FIG. 4 with each other.

That is, the composition change layer 30 may be formed by changing the reactor conditions (for example, a temperature, a pressure, a flow rate of an atmospheric gas, a flow rate of sources, or the like) continuously or discontinuously in time so that the change in the Al composition from the edge of the AlN buffer layer 20 to the edge of the GaN channel layer 40 is in a continuous form, a discontinuous form, or a combination thereof, for the purpose of the linear decrease or the non-linear decrease in value of m during a stacking process of such an $Al_mGa_{1-m}N$ composition change layer 30.

Describing a process in MOCVD for such a composition change layer 30 by way of example, the change in the Al composition between the edge of the AlN buffer layer 20 and the edge of the GaN channel layer 40 may be generated by changing the reactor conditions for a temperature of 1000 to 1200° C., a pressure of 10 to 200 Torr, a flow rate of an atmospheric gas (for example, $N_2$, $H_2$, or a mixture of $N_2$ and $H_2$), a ratio between sources (Al/(Al+Ga) source ratio=0 to 1 and N/group III source ratio=300 to 2000), or the like. Here, group III is a group III element such as Al or Ga. In such an example, when the temperature is raised from 1000° C. to 1200° C., the Al composition may be formed from 100% to 0%, when the pressure is raised from 10 Torr to 200 Torr, the Al composition may be formed from 100% to 0%, when the Al/(Al+Ga) source ratio is lowered from 1 to 0, the Al composition may be formed from 100% to 0%, and when the N/III group source ratio is raised from 300 to 2000, the Al composition may be formed from 100% to 0%. In addition, the Al composition may change to some extent according to the flow rate of the atmospheric gas or the application of a certain atmosphere, such as $N_2$, $H_2$, or a mixture of $N_2$ and $H_2$ as the atmospheric gas. As a more specific example, the composition change layer 30 may be formed so that the change in the Al composition has a tendency of an upward convex nonlinear decrease, a linear decrease, a downward convex nonlinear decrease, or the like, as illustrated in FIG. 3, by appropriately fixing the Al/(Al+Ga) source ratio between 0 and 1 and changing other deposition variables such as the temperature, the pressure, and the atmosphere gas excluding the Al/(Al+Ga) source ratio.

In the above example, for example, in a case of fixing different conditions and decreasing the temperature over time during stacking of the composition change layer 30, as illustrated in FIG. 3, the change in the Al composition from the edge of the AlN buffer layer 20 to the edge of the GaN channel layer 40 may show a tendency of the upward convex nonlinear decrease→the linear decrease→the downward convex nonlinear decrease. In addition, as illustrated in FIG. 4, the supply of the source may be stopped, a growth variable may be adjusted, and the source may then be supplied again to grow so that the composition change layer 30 has a discontinuous (stepwise) change in the composition, and it is natural that a tendency of such a stepwise change may have an upward convex or downward convex stepwise change as in a case of the continuous change of FIG. 3.

Figure 5:
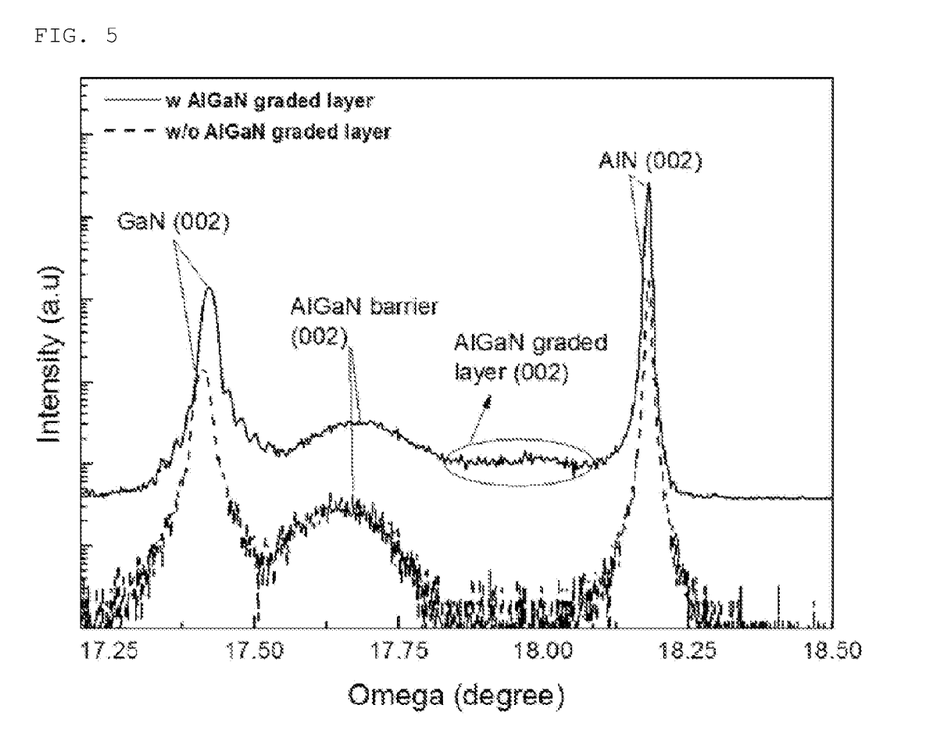
FIG. 5 illustrates an example of an X-ray diffraction analysis result of an HEMT structure showing the presence or absence of the AlGaN composition change layer according to the present invention.

FIG. 5 illustrates an example of an X-ray diffraction analysis result of an HEMT structure showing the presence or absence of the AlGaN composition change layer 30 according to the present invention.

As a result of manufacturing the HEMT structure according to an exemplary embodiment of the present invention as described above and performing an X-ray diffraction analysis, it could be clearly distinguished that a corresponding X-ray diffraction peak (AlGaN graded layer (002)) appeared between the AlN buffer layer 20 and the GaN channel layer 40 in a case where the AlGaN composition change layer 30 is present (w AlGaN graded layer) as compared with a case where the AlGaN composition change layer 30 is absent (w/o AlGaN graded layer), as illustrated in FIG. 5.

FIG. 6 is a view for describing a crystallinity quality of a GaN channel layer according to the presence or absence of the AlGaN composition change layer according to the present invention.

As a result of manufacturing the HEMT structure according to an exemplary embodiment of the present invention as described above and measuring an X-ray diffraction (XRD) intensity, it was confirmed that a crystallinity quality was remarkably improved due to a decrease in full width at half maximum (FWHM) in each of (002)/(102) planes of the GaN channel layer 40 in the case where the AlGaN composition change layer 30 is present (w AlGaN graded layer) as compared with the case where the AlGaN composition change layer 30 is absent (w/o AlGaN graded layer), as illustrated in FIG. 6.

Figure 7:
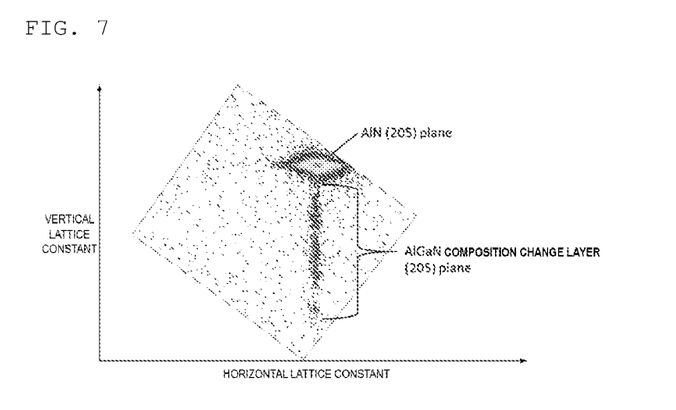
FIG. 7 illustrates an example of an X-ray diffraction reciprocal lattice map of the AlGaN composition change layer according to the present invention.

FIG. 7 illustrates an example of an X-ray diffraction reciprocal lattice map of the AlGaN composition change layer 30 according to the present invention.

In the case where the AlGaN composition change layer 30 is absent, quality deterioration of the GaN channel layer 40 may occur due to compressive stress caused by a difference in lattice constant between the AlN buffer layer 20 and the GaN channel layer 40, but as illustrated in FIG. 7, the AlGaN composition change layer 30 according to the present invention may gradually change a lattice constant [u3] according to a position between the AlN buffer layer 20 and the GaN channel layer 40 to allow the GaN channel layer 40 having a high quality to be formed. That is, in the case where the AlGaN composition change layer 30 is absent, deterioration of crystallinity or a defect or the like may occur due to the compressive stress caused by the difference in lattice constant between the AlN buffer layer 20 and the GaN channel layer 40 to deteriorate a quality of the GaN channel layer 40, but the composition change layer 30 may smoothly change the difference in lattice constant to allow the GaN channel layer 40 having a high quality to be formed as illustrated in FIG. 6.

Figure 8:
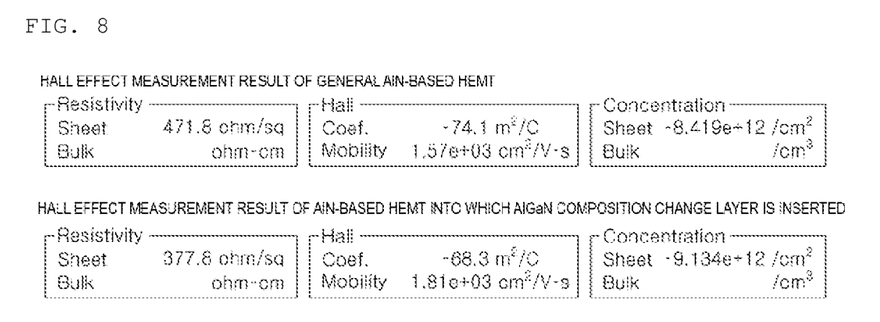
FIG. 8 illustrates an example of comparison results of hall effect measurement for an HEMT structure according to the related art and an HEMT structure according to the present invention.

FIG. 8 illustrates an example of comparison results of hall effect measurement for an HEMT structure according to the related art and an HEMT structure according to the present invention. A GaN layer in the HEMT structure according to the related art and the composition change layer 30 according to the present invention were compared with each other.

As a result of manufacturing and measuring the HEMT structure according to an exemplary embodiment of the present invention as described above, remarkable improvement of characteristics such as a decrease in sheet resistance (for example, 471.8→377.8), an increase in mobility (1.57e+03→1.81e+03), an increase in electron concentration (sheet concentration) (8.419e+12→9.134e+12) was confirmed. Therefore, it can be seen that due to the formation of such a composition change layer 30, as illustrated in FIG. 2B, the degree of generation of the two-dimensional hole gas (2DHG) between the AlN buffer layer 20 and the GaN channel layer 40 may be removed or suppressed (the 2DHG concentration becomes very low as compared with FIG. 1B) to decrease the influence of the coulomb drag on the two-dimensional electron gas (2DEG) layer between the GaN channel layer 40 and the $Al_xIn_yGa_{1-x-y}N$ barrier layer 50 (decrease the drag of the electrons), thereby improving the mobility of the two-dimensional electron gas (2DEG).

As described above, the AlN-based HEMT element according to the present invention may use the AlN buffer layer, have a structure in which the AlGaN composition change layer 30 is inserted into a GaN/AlN interface, remove or suppress the degree of generation of the two-dimensional hole gas (2DHG) to decrease the influence of the coulomb drag on the two-dimensional electron gas (2DEG) layer, and improve the mobility of the two-dimensional electron gas (2DEG). In addition, the AlN-based HEMT element according to the present invention prevents quality deterioration of GaN due to the compressive stress generated in the GaN/AlN structure and allows a GaN thin film having a high quality to be formed, by the inserted AlGaN composition change layer 30.

The present invention has been described by specific matters such as specific components, exemplary embodiments, and the accompanying drawings hereinabove, but they have been provided only for assisting in the entire understanding of the present invention. Therefore, the present invention is not limited to the exemplary embodiments described above, and may be variously modified and altered by those skilled in the art to which the present invention pertains without departing from the spirit and scope of the present invention. Therefore, the scope of the present invention should not be construed as being limited to the exemplary embodiments described above, and not only the following claims but also all modifications equal or equivalent to these claims should be construed to fall within the scopes and spirits of the disclosure.

DESCRIPTION OF REFERENCE NUMERALS 10 semiconductor substrate
20 AlN buffer layer
30 AlGaN composition change layer
40 GaN channel layer
41 AlN insertion layer
50 $Al_xIn_yGa_{1-x-y}N$ barrier layer

The invention claimed is:
1. A method of manufacturing ALUMINUM NITRIDE-based transistor, comprising:
   forming a sequentially stacked structure in which an AlN buffer layer, a composition change layer, a GaN channel layer, and an $Al_xIn_yGa_{1-x-y}N$ barrier layer (here, x and y are real numbers between 0 and 1) are sequentially stacked on a semiconductor substrate,
   wherein the composition change layer is an $Al_mGa_{1-m}N$ layer whose Al composition is changed from the AlN buffer layer to a position of the GaN channel layer, and is a layer formed so that m is a real value decreasing from an edge of the AlN buffer layer to an edge of the GaN channel layer, and
   wherein m is changed as a value that is non-linearly decreased from the edge of the AlN buffer layer to the edge of the GaN channel layer so that a rate of change is larger at the edge of the AlN buffer layer, or is non-linearly decreased so that a rate of change is larger at the edge of the GaN channel layer.
2. The method of manufacturing ALUMINUM NITRIDE-based transistor of claim 1, wherein m is 0.8 to

1.0 at the edge of the AlN buffer layer, and is 0.0 to 0.2 at the edge of the GaN channel layer.

3. The method of manufacturing ALUMINUM NITRIDE-based transistor of claim 1, wherein the semiconductor substrate includes a single crystal substrate formed of SiC, Si, or GaN.

4. The method of manufacturing ALUMINUM NITRIDE-based transistor of claim 1, wherein the sequentially stacked structure is obtained by performing an in-situ process in a metal-organic chemical vapor deposition (MOCVD) or molecular beam epitaxy (MBE) equipment.

5. The method of manufacturing ALUMINUM NITRIDE-based transistor of claim 1, wherein in formation of the composition change layer, a change in an Al composition between the edge of the AlN buffer layer and the edge of the GaN channel layer is obtained by changing reactor conditions including a temperature, a pressure, a flow rate of an atmospheric gas, or a ratio between Al, Ga, and N sources of a reactor.

6. The method of manufacturing ALUMINUM NITRIDE-based transistor of claim 1, wherein the composition change layer is formed by changing reactor conditions continuously or discontinuously in time so that the change in the Al composition from the edge of the AlN buffer layer to the edge of the GaN channel layer is in a continuous form, a discontinuous form, or a combination thereof, in the non-linear decrease.

7. The method of manufacturing ALUMINUM NITRIDE-based transistor of claim 1, further comprising stacking an AlN insertion layer between the GaN channel layer and the $Al_xIn_yGa_{1-x-y}N$ barrier layer in a case where the $Al_xIn_yGa_{1-x-y}N$ barrier layer is not formed of AlN.

8. The method of manufacturing ALUMINUM NITRIDE-based transistor of claim 7, wherein the AlN insertion layer has a thickness of 5 to 20 Å.

9. The method of manufacturing ALUMINUM NITRIDE-based transistor of claim 1, wherein the method of manufacturing a high electron mobility transistor is to be applied to operate a transistor by using a two-dimensional electron gas (2DEG) formed between the GaN channel layer and the $Al_xIn_yGa_{1-x-y}N$ barrier layer due to spontaneous and piezoelectric polarization for electron flow between a source terminal and a drain terminal.

10. The method of manufacturing ALUMINUM NITRIDE-based transistor of claim 1, wherein due to formation of the composition change layer, a degree of generation of a two-dimensional hole gas (2DHG) between the AlN buffer layer and the GaN channel layer is removed or suppressed to decrease an influence of a coulomb drag on a two-dimensional electron gas (2DEG) layer between the GaN channel layer and the $Al_xIn_yGa_{1-x-y}N$ barrier layer, thereby improving mobility of a two-dimensional electron gas (2DEG), and the composition change layer prevents quality deterioration of the GaN channel layer due to compressive stress generated between the AlN buffer layer and the GaN channel layer to allow the GaN channel layer having a high quality to be formed.

11. An ALUMINUM NITRIDE-based transistor element comprising:

a sequentially stacked structure in which an AlN buffer layer, a composition change layer, a GaN channel layer, and an $Al_xIn_yGa_{1-x-y}N$ barrier layer (here, x and y are real numbers between 0 and 1) are sequentially stacked on a semiconductor substrate, wherein the composition change layer is an $Al_mGa_{1-m}N$ layer whose Al composition is changed from the AlN buffer layer to a position of the GaN channel layer, and is a layer formed so that m is a real value decreasing from an edge of the AlN buffer layer to an edge of the GaN channel layer, and wherein m is changed as a value that is non-linearly decreased from the edge of the AlN buffer layer to the edge of the GaN channel layer so that a rate of change is larger at the edge of the AlN buffer layer, or is non-linearly decreased so that a rate of change is larger at the edge of the GaN channel layer.

* * * * *